(12) United States Patent
Kondo

(10) Patent No.: US 10,609,851 B2
(45) Date of Patent: Mar. 31, 2020

(54) MOUNTER

(71) Applicant: FUJI CORPORATION, Chiryu-shi (JP)

(72) Inventor: Hironori Kondo, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 264 days.

(21) Appl. No.: 15/549,774

(22) PCT Filed: Feb. 10, 2015

(86) PCT No.: PCT/JP2015/053644
§ 371 (c)(1),
(2) Date: Aug. 9, 2017

(87) PCT Pub. No.: WO2016/129057
PCT Pub. Date: Aug. 18, 2016

(65) Prior Publication Data
US 2018/0035580 A1    Feb. 1, 2018

(51) Int. Cl.
*B23P 19/00*    (2006.01)
*H05K 13/08*    (2006.01)
(Continued)

(52) U.S. Cl.
CPC .......... *H05K 13/08* (2013.01); *G06T 7/0004* (2013.01); *H04N 7/183* (2013.01);
(Continued)

(58) Field of Classification Search
CPC ... G06T 7/0004; H05K 13/0815; H04N 7/183
See application file for complete search history.

(56) References Cited

U.S. PATENT DOCUMENTS 6,983,538 B2 *    1/2006    Inoue ................. H05K 13/0469
                                                            228/8
7,356,918 B2 *    4/2008    Okuda ................. H05K 13/083
                                                            29/833
(Continued)

FOREIGN PATENT DOCUMENTS

JP    3-157994 A    7/1991
JP    4-113697 A    4/1992
(Continued)

OTHER PUBLICATIONS

Extended European Search Report dated Jan. 31, 2018 in Patent Application No. 15881932.6, citing references AO-AQ therein, 7 pages.
(Continued)

*Primary Examiner* — Paul D Kim
(74) *Attorney, Agent, or Firm* — Oblon, McClelland, Maier & Neustadt, L.L.P.

(57) ABSTRACT

An electronic component mounter where information indicating completion of component mounting is memorized each time a component is mounted on circuit board by suction nozzle. Then, in a case in which mounting work is interrupted by a stoppage of the electronic component mounter and then restarted, the mounting position of the electronic component is imaged by mark camera according to information memorized immediately before the mounting work was interrupted. Also, with the electronic component mounter, in a case in which mounting work is interrupted by a stoppage of the mounter and then restarted, the mark camera is moved along a path over which the suction nozzle moved until the position of the suction nozzle when mounting work was interrupted. Here, imaging of the circuit board is performed by the mark camera.

3 Claims, 5 Drawing Sheets

(51) Int. Cl.
*G06T 7/00* (2017.01)
*H04N 7/18* (2006.01)

(52) U.S. Cl.
CPC .............. *H05K 13/0815* (2018.08); *G06T 2207/10004* (2013.01); *G06T 2207/30141* (2013.01)

(56) References Cited

U.S. PATENT DOCUMENTS

| | | | |
|---|---|---|---|
| 8,328,074 B2 * | 12/2012 | Nagai | H05K 3/341 228/180.22 |
| 2006/0048380 A1 | 3/2006 | Okuda et al. | |
| 2017/0202117 A1 * | 7/2017 | Kito | H05K 13/08 |

FOREIGN PATENT DOCUMENTS

| | | |
|---|---|---|
| JP | 2003-31998 A | 1/2003 |
| JP | 2004-186308 A | 7/2004 |
| JP | 2005-197372 A | 7/2005 |
| JP | 2012-234902 A | 11/2012 |
| JP | 2014-241373 A | 12/2014 |

OTHER PUBLICATIONS

International Search Report dated Apr. 7, 2015 in PCT/JP2015/053644 filed Feb. 10, 2015.

* cited by examiner

MOUNTER

TECHNICAL FIELD

The present application relates to a mounter that performs work of mounting components on a board.

BACKGROUND ART

Mounters pick up and hold an electronic component supplied by a component supply device and mount the electronic component on a circuit board. Work of mounting electronic components is complete when multiple predetermined electronic components have been mounted on the circuit board, but there are cases in which mounting work is interrupted due to reasons such as an emergency stop of the mounter. In such a case, as disclosed in the patent literature below, mounting work is restarted based on information related to mounting components saved on a storage medium.

In detail, with the mounter disclosed in the patent literature below, every time an electronic component is mounted on a circuit board by a component holding tool, mounting component data that is information related to the mounted component is saved on the storage medium. And, in a case in which mounting work is interrupted by an emergency stop of the mounter or the like and then restarted, mounting component information saved immediately before the interruption of mounting work is extracted, and the component planned to be mounted next identified from the mounting component information is mounted on the circuit board. This makes it possible to restart interrupted mounting work.

Patent literature 1: JP-A-2003-31998

SUMMARY

Technical Problem

According to the mounter disclosed in the above patent literature, it is possible to restart interrupted mounting work. However, in a case in which mounting work is interrupted due to an emergency stop of the mounter occurring within a very short time during mounting of an electronic component on a circuit board, that is, within a few seconds before or after an electronic component is mounted on the circuit board, there are cases in which the timings of mounting the electronic component and saving the mounting component information on the storage medium are reversed, meaning that the saved mounting component information is different from the actual mounting state of electronic components. In such a case, when mounting work is restarted, there is a worry that mounting work will not be restarted appropriately.

Also, if the mounter stops at timing of mounting an electronic component on a circuit board, not only may there be a difference between mounting component information saved on the storage medium and the actual mounting state of electronic components, an electronic component may not be appropriately mounted on the circuit board due to a stoppage of a moving device that moves the component holding tool. In such a case also, there is a worry that mounting work will not be restarted appropriately.

Further, not only at the timing when an electronic component is mounted on a circuit board, but also when the component holding tool holding the electronic component is moved above the circuit board by operation of a moving device, if an emergency stop of the mounter occurs, there is a worry that the electronic component will separate from the component holding tool and the electronic component will drop on the circuit board. In such a case also, there is a worry that mounting work will not be restarted appropriately. The present disclosure takes account of such circumstances and an object thereof is to appropriately restart mounting work after a mounting work interruption.

Solution to Problem

To solve the above problems, a mounter of the present disclosure is a mounter including: a component holding tool configured to hold a component and mount the held component on a board; an imaging device configured to image any position on a base on which the board is loaded; a control device including a memory section configured to memorize information indicating completion of mounting of the component on the board for each act of mounting the component on the board by the component holding tool, and a mounting position imaging section configured to, in a case in which mounting work is interrupted by a stoppage of the mounter and then restarted, use the imaging device to image the mounting position of the component on the board memorized on the memory section immediately before the mounting work was interrupted.

Also, to solve the above problems, a mounter of the present disclosure is a mounter including: a component holding tool configured to hold a component and mount the held component on a board; an imaging device configured to image any position on a base on which the board is loaded; a control device including a path imaging section configured to, in a case in which mounting work is interrupted by a stoppage of the mounter and then restarted, use the imaging device to image the base on which the board is loaded along a path over which the component holding tool moved until the position of the component holding tool when mounting work was interrupted; a dropped component determination section configured to determine whether the component dropped on the base on which the board is loaded based on image data captured by the path imaging section; and a dropped notification section configured to report information to an operator indicating that a component has been dropped in a case in which the component was determined to have been dropped by the dropped component determination section.

Advantageous Effects

With a mounter of the present disclosure, in a case in which mounting work is interrupted by a stoppage of the mounter and then restarted, the mounting position of the electronic component is imaged by the imaging device according to mounting component information memorized immediately before the mounting work was interrupted. By this, it is possible to judge whether mounting work immediately before the interruption was performed appropriately, and it is possible to appropriately restart mounting work. Also, with a mounter of the present disclosure, in a case in which mounting work is interrupted by a stoppage of the mounter and then restarted, the imaging device is moved along a path over which the component holding tool moved until the position of the holding tool when mounting work was interrupted. During this time, the imaging device images the base on which the board is loaded. Accordingly, it is possible to determine whether an electronic component has dropped on the circuit board or on the base, and it is possible to appropriately restart mounting work.

DESCRIPTION OF PREFERRED EMBODIMENTS

The following describes in detail referring to the figures an example embodiment of the present disclosure.

Configuration of Electronic Component Mounter.

Figure 1:
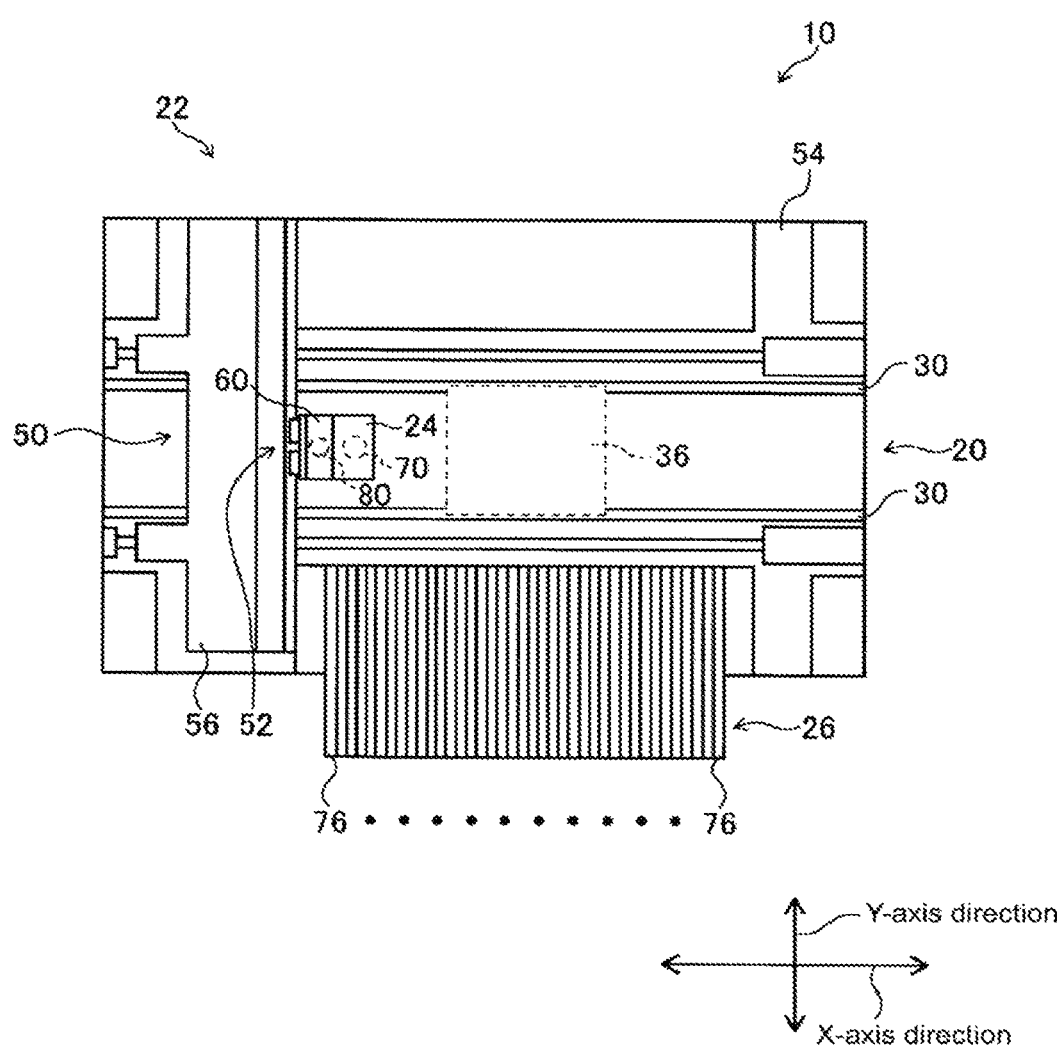
FIG. 1 is a plan view of an electronic component mounter.

Electronic component mounter 10 is shown in FIG. 1. Electronic component mounter 10 is a working machine that mounts electronic components on a circuit board. Electronic component mounter 10 is provided with conveyance device 20, mounting head moving device (hereinafter in some cases abbreviated to "moving device") 22, mounting head 24, and supply device 26.

Conveyance device 20 has a pair of conveyor belts 30 that extend in the X-axis direction, and electromagnetic motor (refer to FIG. 2) 32 that moves conveyor belts 30. Circuit board 36 is supported by this pair of conveyor belts 30 and is conveyed in the X-axis direction by the driving of electromagnetic motor 32. Also, conveyance device 20 has holding device (refer to FIG. 2) 38. Holding device 38 fixedly holds circuit board 36 supported by conveyor belts 30 in a predetermined position (the position at which circuit board 36 is shown in FIG. 1).

Moving device 22 is configured from X-axis direction sliding mechanism 50 and Y-axis direction sliding mechanism 52. X-axis direction slide mechanism 50 has X-axis slider 56 provided on base 54 so as to be movable in the X-axis direction. X-axis slider 56 is moved to any position in the X-axis direction by the driving of electromagnetic motor (refer to FIG. 2) 58. In addition, Y-axis direction slide mechanism 52 has Y-axis slider 60 provided on a side surface of X-axis slider 56 so as to be movable in the Y-axis direction. Y-axis slider 60 is moved to any position in the Y-axis direction by the driving of electromagnetic motor (refer to FIG. 2) 62. Mounting head 24 is attached to Y-axis slider 60. According to such a structure, mounting head 24 is moved to any position on base 54 by moving device 22.

Mounting head 24 mounts electronic components on circuit board 36. Mounting head 24 includes suction nozzle 70 that is provided on a lower end surface of the mounting head. Suction nozzle 70 is connected to positive/negative pressure supply device (refer to FIG. 2) 72 via a negative pressure air/positive pressure air supply passage. Suction nozzle 70 picks up and holds an electronic component using negative pressure, and releases the held electronic component using positive pressure.

Supply device 26 is a feeder type supply device that has multiple tape feeders 76. Tape feeders 76 house taped components in a wound state. Taped components are electronic components that have been put into tape. Tape feeders 76 deliver the taped components using indexing device (refer to FIG. 2) 78. By this, feeder type supply device 26 supplies an electronic component to a supply position by the indexing of taped components.

Also, electronic component mounter 10 is provided with mark camera 80 and display device (refer to FIG. 2) 82. Mark camera 80 is provided facing down on a lower end surface of Y-axis slider 60 of moving device 22. By this, mark camera 80 is able to image any position on base 54. Display device 82 is provided at a position visible to an operator, and information related to work is displayed on display device 82.

Figure 2:
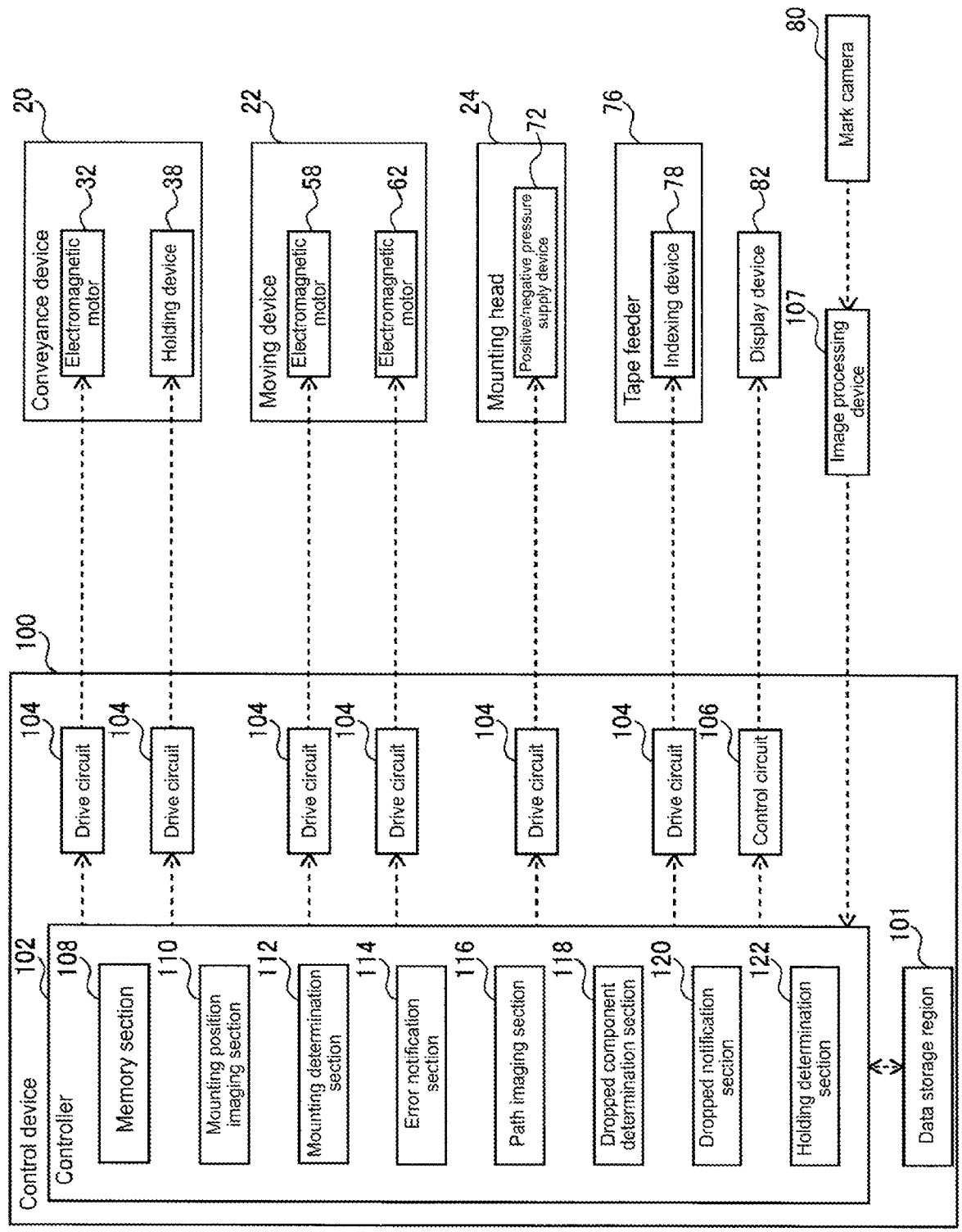
FIG. 2 is a block diagram showing a control device.

Further, as shown in FIG. 2, electronic component mounter 10 is provided with control device 100. Control device 100 is provided with data storage region 101, controller 102, multiple drive circuits 104, and control circuit 106. The multiple drive circuits 104 are connected to the above electromagnetic motors 32, 58, and 62, holding device 38, positive/negative pressure supply device 72, and indexing device 78. Controller 102 is provided with a CPU, ROM, RAM, and so on, is formed mainly from a computer, and is connected to the multiple drive circuits 104. By this, operation of conveyance device 20, moving device 22, and so on is controlled by controller 102.

Controller 102 is also connected to control circuit 106, and control circuit 106 is connected to display device 82. By this, a given image is displayed on display device 82. Also, data storage region 101 is for memorizing various information and is connected to controller 102. By this, controller 102 acquires various information memorized in data storage region 101. Further, controller 102 is also connected to image processing device 107. Image processing device 107 is for processing image data acquired by mark camera 80, and controller 102 acquires various information from the image data.

Mounting Work by the Electronic Component Mounter

With electronic component mounter 10, mounting work of mounting electronic components on circuit board 36 is performed using the above configuration. Specifically, circuit board 36 is conveyed to a work position by conveyance device 20, and is fixedly held at that position by holding device 38. Also, tape feeders 76 feed taped components and supply electronic components to supply positions. Then, mounting head 24 moves above the supply position of the electronic component and picks up and holds the electronic component using suction nozzle 70. Continuing, mounting head 24 moves above the circuit board and mounts the held electronic component on the circuit board. Then, when mounting work is complete for the circuit board 36, by operation of conveyance device 20, the circuit board 36 for which mounting work is complete is unloaded from electronic component mounter 10.

Checking the Mounting Position and Path when Mounting Work Restarts

With electronic component mounter 10, as given above, an electronic component supplied by tape feeder 76 is picked up and held by suction nozzle 70 and then mounted on the circuit board. Work of mounting electronic components on circuit board 36 is complete when multiple predetermined electronic components have been mounted on circuit board 36, but there are cases in which mounting work is interrupted due to reasons such as an emergency stop of electronic component mounter 10. In such a case, mounting work is restarted based on information related to mounting component memorized on data storage region 101.

In detail, with electronic component mounter 10, every time an electronic component is mounted on circuit board 36 by suction nozzle 70, mounting component data that is information related to the mounted component is saved in data storage region 101. Note that, mounting component information includes information such as the type of mounted electronic component, and the position of the mounted electronic component. And, in a case in which mounting work is interrupted by an emergency stop of electronic component mounter 10 or the like and then restarted, mounting component information memorized immediately before the interruption of mounting work is extracted, and the component planned to be mounted next identified from the mounting component information is mounted on circuit board 36. However, in a case in which mounting work is interrupted due to an emergency stop of electronic component mounter 10 occurring within a very short time during mounting of an electronic component on circuit board 36, that is, within a few seconds before or after an electronic component is mounted on circuit board 36, there are cases in which the timings of mounting the electronic component and memorizing the mounting component information in data storage region 101 are reversed, meaning that the mounting component information memorized in data storage region 101 is different from the actual mounting state of electronic components. In such a case, when mounting work is restarted, there is a worry that mounting work will not be restarted appropriately.

Specifically, for example, there are cases in which mounting component information of an electronic component is memorized in data storage region 101 on the assumption that mounting work of mounting the electronic component to circuit board 36 is completed when a specified amount of positive pressure is supplied to suction nozzle 70. In such a case, if mounting work is interrupted immediately after the specified amount of positive pressure is supplied to suction nozzle 70, the mounting component information of that electronic component is memorized in data storage section 101. However, there may be cases in which due to the stoppage of positive/negative pressure supply device 72, the supply of positive pressure to suction nozzle 70 becomes insufficient, and the electronic component fails to separate from suction nozzle 70 and is not mounted on circuit board 36. That is, although mounting component information is memorized in data storage region 101, the electronic component corresponding to that mounting component information may not be mounted on circuit board 36. In such a case, if mounting work is restarted according to the above procedure, because mounting component information of the electronic component is memorized in data storage region 101 even though that electronic component was not mounted, a defective board will be produced with the electronic component not mounted on circuit board 36.

Also, if mounting work is interrupted immediately before the specified amount of positive pressure is supplied to suction nozzle 70, the mounting component information of that electronic component is not memorized in data storage section 101. However, the electronic component may separate from suction nozzle 70 and be mounted on circuit board 36 before the specified amount of positive pressure is supplied to suction nozzle 70. That is, although mounting component information is not memorized in data storage region 101, the electronic component corresponding to that mounting component information may be mounted on circuit board 36. In such a case, if mounting work is restarted according to the above procedure, an electronic component may be mounted on top of the already mounted electronic component. That is, double mounting of electronic components may occur.

Also, if electronic component mounter 10 is stopped as the electronic component is mounted on circuit board 36, not only may there be a difference between mounting component information memorized in data storage region 101 and the actual mounting state of electronic components, an electronic component may not be appropriately mounted on circuit board 36 due to the stoppage of positive/negative pressure supply device 72, moving device 22, and so on.

Further, not only at the timing when an electronic component is mounted on circuit board 36, but also when suction nozzle 70 holding the electronic component is moved above circuit board 36 or base 54 by operation of moving device 22, if an emergency stop of electronic component mounter 10 occurs, there is a worry that the electronic component will separate from suction nozzle 70 and will drop on circuit board 36 or base 54. Here, if the electronic component that dropped is left on circuit board 36, this will result in a defective board.

Thus, with electronic component mounter 10, in a case in which mounting work is interrupted by an emergency stop of electronic component mounter 10 or the like and then restarted, checking of the mounting position of the electronic component mounted immediately before mounting work was interrupted is performed, and checking of the movement path of suction nozzle 70 is performed.

In detail, in a case in which mounting work is interrupted by an emergency stop of electronic component mounter 10 or the like and then restarted, mounting component information memorized immediately before the interruption of mounting work is extracted, and the mounting position of the electronic component according to that mounting component information is identified. When the mounting position of the electronic component is identified, mark camera 80 is moved by operation of moving device 22 above the identified mounting position, and that mounting position is imaged by mark camera 80. Then, image data obtained from that image is analyzed at controller 102, and it is determined whether the electronic component is appropriately mounted at the identified mounting position. Note, with this determination, whether the electronic component is mounted at the mounting position is determined, and in a case in which the electronic component is mounted at the mounting position, whether the electronic component is appropriately mounted at the planned mounting position is determined. That is, in cases such as when the electronic component is not mounted at the mounting position, or the electronic component is mounted at the planned mounting position in a deviated state, it is determined that the electronic component is not appropriately mounted at the mounting position. Then, when it is determined that the electronic component is not appropriately mounted at the identified mounting position, a screen indicating that fact (referred to below as "mounting error warning screen") is displayed on display device 82. By this, an operator is made aware that mounting work has not been performed appropriately at the identified mounting position, and can perform countermeasures to inappropriate mounting work. That is, an operator can perform countermeasures to prevent the occurrence of a missing electronic component due to mounting component information being memorized in data storage region 101 but the electronic component according to that mounting component information not having been mounted on circuit board 36, and countermeasures to inappropriate mounting of an electronic component that occurs due to an emergency stop of electronic component mounter 10.

Also, with electronic component mounter 10, in a case in which mounting work is interrupted by an emergency stop of electronic component mounter 10 or the like and then restarted, controller 102 determines whether suction nozzle 70 is holding the electronic component planned to be held after mounting work is restarted. Note that, the presence or absence of an electronic component being held on suction nozzle 70 is determined based on the amount of negative pressure supplied by positive/negative supply device 72.

And, in a case in which the electronic component planned to be held is not being held by suction nozzle 70, mark camera 80 is moved along the movement path of suction nozzle 70 and imaging is performed by mark camera 80. In detail, during mounting work, the movement path of mounting head 24 by moving device 22 is memorized in data storage region 101. Then, in a case in which mounting work is interrupted by an emergency stop of electronic component mounter 10 or the like and then restarted, the movement path of mounting head 24 until the position where mounting work was interrupted is extracted from data storage region 101. Note that, the starting point of the extracted movement path is the supply position of the electronic component at tape feeder 76. That is, the movement path of mounting head 24 from the supply position of the electronic component at tape feeder 76 to the position of mounting head 24 when mounting work was interrupted is extracted from the movement path of mounting head 24.

When the movement path of mounting head 24 is extracted, mounting head 24 is moved by operation of moving device 22 along the extracted movement path of mounting head 24. Here, circuit board 26 and base 54 are imaged by mark camera 80. Then, image data obtained from that imaging is analyzed at controller 102, and it is determined whether the electronic component dropped on circuit board 36 or base 54. Note that, with this determination, it is determined whether an electronic component is present at a position other than according to the mounting component information memorized in data storage region 101, and in a case in which an electronic component is present at a position other than according to the mounting component information memorized in data storage region 101, it is determined that an electronic component has dropped on circuit board 36 or base 54. And, in a case in which it is determined that an electronic component has not dropped on circuit board 36 or base 54, a screen indicating that fact (referred to below as "no dropped component warning screen") is displayed on display device 82.

On the other hand, in a case in which it is determined that an electronic component has dropped on circuit board 36 or base 54, it is determined whether that dropped electronic component is the electronic component mounted at the correct mounting position. Note, with this determination, it is determined whether the mounting position of the electronic component planned to be mounted next according to the mounting component information memorized immediately before mounting work was interrupted and the position of the electronic component determined to have been dropped match, and if it is determined that they match, the dropped electronic component is determined to be the electronic component mounted at the correct mounting position. That is, as given above, in a case in which an electronic component according to the mounting component information is mounted on circuit board 36 even though the component mounting information is not memorized in control device 100, that component is determined to be a dropped component, and that dropped component is determined to be the electronic component mounted at the correct mounting position. Then, in a case in which that dropped electronic component is determined to be the electronic component mounted at the correct mounting position, it is determined that mounting work of that component is complete, and mounting component information according to that component is memorized in control device 100. By this, even if mounting component information is not memorized in control device 100, because the electronic component according to that mounting component information is mounted on circuit board 36, it is possible to prevent double-mounting of the electronic component.

Also, in a case in which it is determined that the dropped electronic component is not the electronic component mounted at the correct mounting position, a screen indicating that the electronic component has been dropped on circuit board 36 or base 54 (referred to as "dropped component present warning screen") is displayed on display device 82. Note that, information indicating the position of the dropped component is also displayed on the dropped component present warning screen. Note that, information indicating the position of the dropped component is calculated based on image data from mark camera 80 and information related to the movement position of mounting head 24 moved by moving device 22. By this, an operator can easily perform collection of the dropped electronic component.

Control Program

Figure 3:
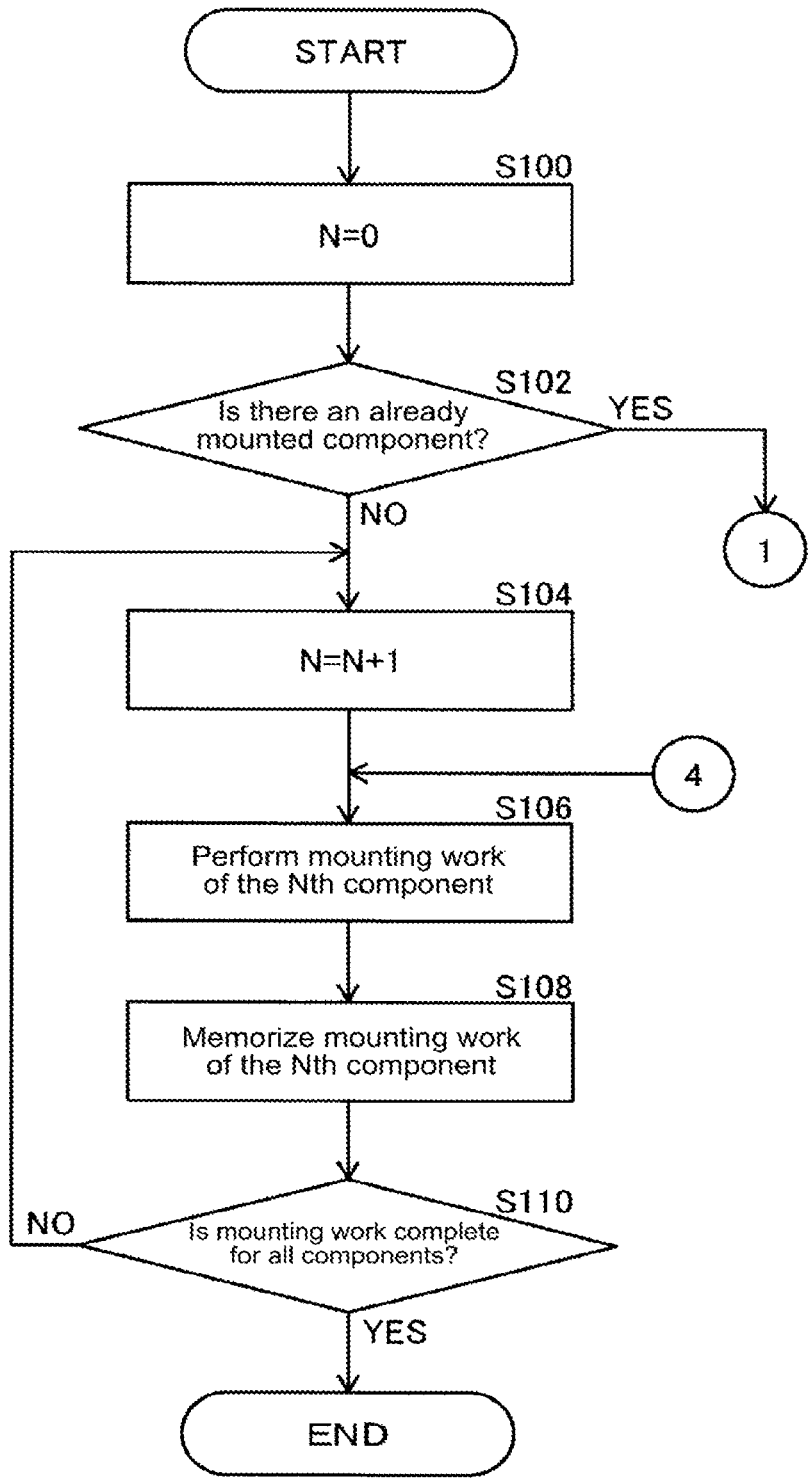
FIG. 3 shows a flowchart of a control program.
Figure 4:
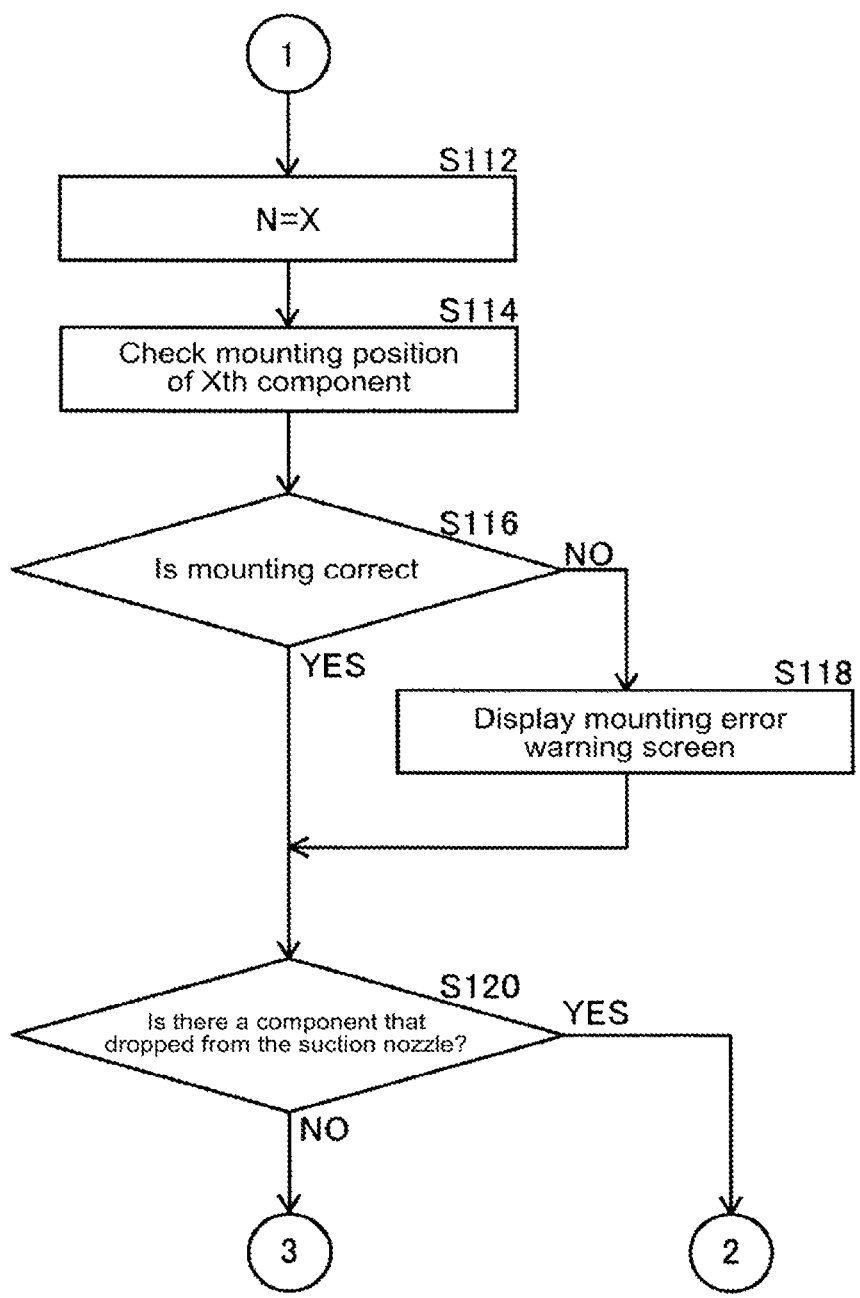
FIG. 4 shows a flowchart of a control program.
Figure 5:
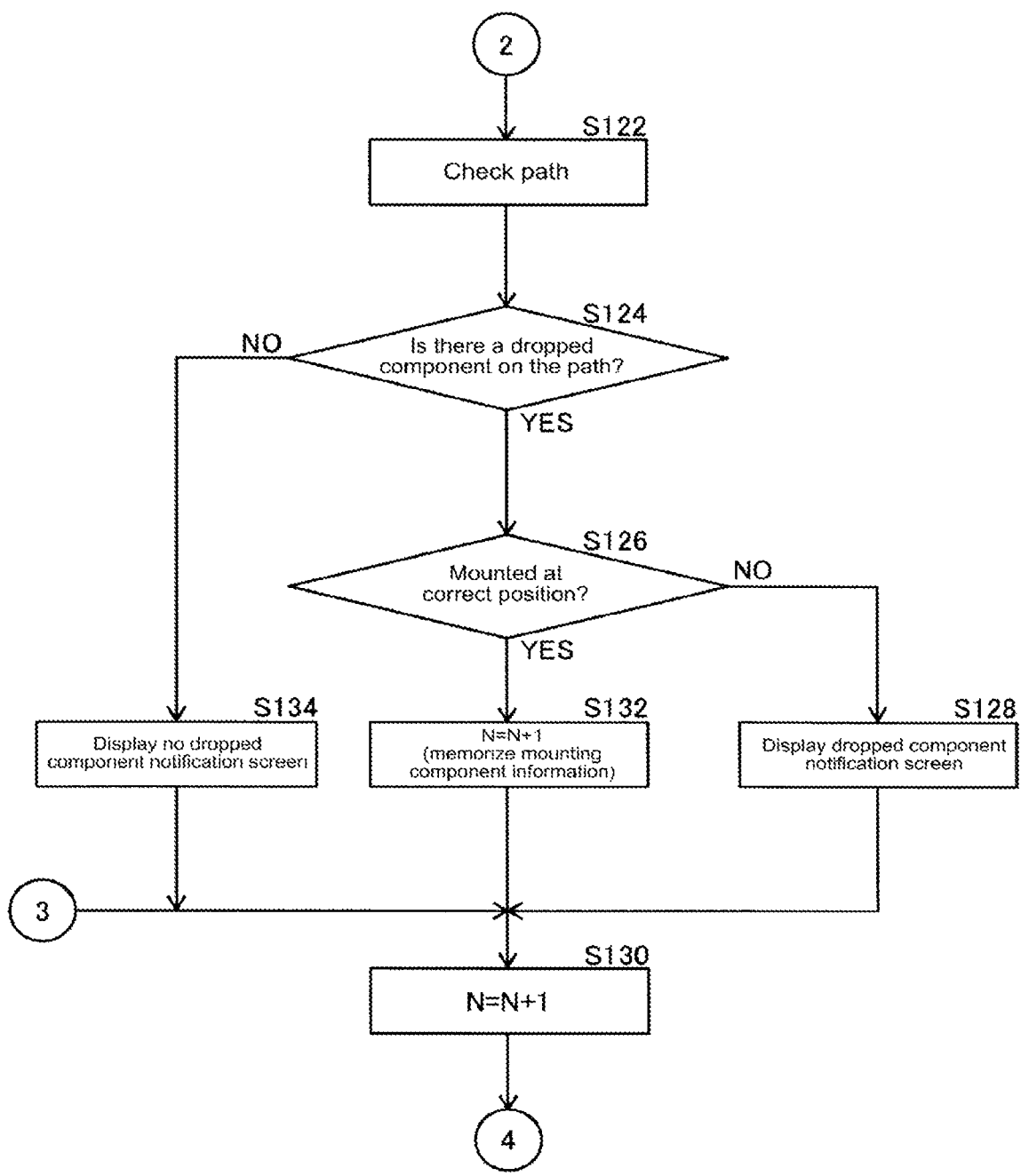
FIG. 5 shows a flowchart of a control program.

The above mounting work of electronic components and work of checking the mounting position and path at restart of mounting work is performed by a control program being run on control device 100. The flow when this control program is run is described below with reference to FIGS. 3 to 5.

With the control program, first, the Nth electronic component that is the target for mounting work is made to be zero (S100). Next, it is determined whether there is an electronic component already mounted on circuit board 36 (S102). That is, it is determined whether mounting component information is memorized in data storage region 101. Here, if mounting component information is not memorized in data storage region 101 (S102 is no), one is added to N (S104). Next, mounting work of the Nth electronic component is performed (S106).

Then, when mounting work of the Nth electronic component is performed, mounting component information according to that Nth electronic component is memorized in data storage region 101 (S108). Continuing, it is determined whether mounting work is complete for all the electronic components to be mounted on circuit board 36 (S110). Then, in a case in which mounting work is not complete for all the electronic components (S110 is no), processing returns to S104. On the other hand, in a case in which mounting work is complete for all the electronic components (S110 is yes), the control program ends. In this manner, if mounting work is not interrupted, by performing processing of S100 to S110, mounting work on circuit board 36 is performed.

On the other hand, in a case in which mounting work is interrupted and then restarted, the control program is run, but when mounting work is restarted, because mounting component information is memorized in data storage region 101 before mounting work is interrupted, in S102 it is determined that there is an already mounted electronic component on circuit board 36. Then, in a case when it is determined that there is an already mounted electronic component on circuit board 36 (S102 is yes), the Nth electronic component that is a target for mounting work is taken as X (S112). Here, X is the number of the electronic component according to the mounting component information memorized in data storage region 101 immediately before mounting work was interrupted.

Next, when the Nth electronic component that is a target for mounting work is taken as X, mark camera 80 is moved above the mounting position of that Xth electronic component, and the mounting position is imaged by mark camera 80 (S114). Then, based on the image data obtained by the imaging, it is determined whether the electronic component is appropriately mounted at the mounting position (S116). In a case in which it is determined that the electronic component is not appropriately mounted at the mounting position (S116 is no), a mounting error warning screen is displayed on display device 82 (S118). Then, processing proceeds to S120. On the other hand, in a case in which it is determined that the electronic component is appropriately mounted at the mounting position (S116 is yes), processing of S118 is skipped, and processing proceeds to S120.

In S120, it is determined whether the electronic component dropped from suction nozzle 70. That is, it is determined whether suction nozzle 70 is holding the electronic component that is planned to be held. Then, in a case in which it is determined that the electronic component planned to be held is not being held by suction nozzle 70, that is, it is determined that the electronic component has dropped from suction nozzle 70 (S120 is yes), the movement path of mounting head 24 until the position of mounting head 24 when mounting work was interrupted is extracted from data storage region 101, and mark camera 80 performs imaging along that movement path (S122).

Then, based on the image data obtained by the imaging, it is determined whether the electronic component was dropped on the movement path (S124). In a case in which it is determined that the electronic component has dropped on the movement path (S124 is yes), it is determined whether that dropped electronic component is the electronic component mounted at the correct mounting position (S126). In a case in which it is determined that the dropped electronic component is not the electronic component mounted at the correct mounting position (S126 is no), the dropped component present warning screen is displayed on display device 82 (S128). Then, processing proceeds to S130.

On the other hand, in a case in which it is determined that the dropped electronic component is the electronic component mounted at the correct position (S126 is yes), mounting component information according to that electronic component is memorized in data storage region 101, and as it is necessary to indicate that mounting work of that electronic component is complete, one is added to the Nth electronic component that is the target for mounting work (S132). Then, processing proceeds to S130.

Next, in S130, the interrupted mounting work should be restarted, so one is added to the Nth electronic component that is the target for mounting work. Then, processing returns to S106. Also, in a case in which it is determined in S124 that the electronic component has not dropped on the movement path (S124 is no), the no dropped component warning screen is displayed on display device 82 (S134). Then, processing from S130 is performed. Also, in a case in which it is determined in S120 that the electronic component has not dropped from suction nozzle 70 (S120 is no), processing from S130 is performed.

Note that, controller 102 of control device 100 should perform work of checking the mounting position and path when mounting work is restarted, thus, as shown in FIG. 2, controller 102 includes memory section 108, mounting position imaging section 110, mounting determination section 112, error notification section 114, path imaging section 116, dropped component determination section 118, dropped notification section 120, and holding determination section 122. Memory section 108 is a functional section for performing processing of S108 and S132 of the above control program, that is, processing of memorizing mounting component information of an electronic component for which mounting work is complete in data storage region 101.

Mounting position imaging section 110 is a functional section for performing processing of S114 of the above control program, that is, processing of imaging the mounting position using mark camera 80. Mounting determination section 112 is a functional section for performing processing of S116 of the above control program, that is, processing of determining whether an electronic component is appropriately mounted at the mounting position. Error notification section 114 is a functional section for performing processing of S118 of the above control program, that is, for performing processing of notifying an operator that the electronic component is not appropriately mounted at the mounting position. Path imaging section 116 is a functional section for performing processing of S122 of the above control program, that is, for performing processing of imaging the movement path of mounting head 24 using mark camera 80. Dropped component determination section 118 is a functional section for performing processing of S124 of the above control program, that is, for performing processing of determining whether an electronic component dropped on the movement path of mounting head 24. Dropped notification section 120 is a functional section for performing processing of S128 of the above control program, that is, for performing processing of notifying that an electronic component dropped on the movement path of mounting head 24. Holding determination section 122 is a functional section for performing processing of S120 of the above control program, that is, processing of determining whether an electronic component planned to be held is being held on suction nozzle 70.

Note that, in the above embodiments, electronic component mounter 10 is an example of a mounter. Baser 54 is an example of a base. Suction nozzle 70 is an example of a component holding tool. Mark camera 80 is an example of an imaging device. Control device 100 is an example of a control device. Memory section 108 is an example of a memory section. Mounting position imaging section 110 is an example of a mounting position imaging section. Mounting determination section 112 is an example of a mounting determination section. Error notification section 114 is an example of an error notification section. Path imaging section 116 is an example of a path imaging section. Dropped component determination section is an example of a dropped component determination section. Dropped notification section 120 is an example of a dropped notification section. Holding determination section 122 is an example of a holding determination section.

Further, the present disclosure is not limited to the above example embodiments, and various changed or improved methods of embodiment are possible based on the knowledge of someone skilled in the art. Specifically, for example, in the above embodiments, the mounting error warning screen and the like are displayed on display device 82, but the contents of the screen may be notified to an operator using sound or the like.

Also, in the above embodiments, controller 102 determines whether an electronic component is appropriately mounted at the mounting position based on image data of the mounting position, but an operator may make this determination. That is, an image based on the image data of the mounting position may be displayed on display device 82, and an operator may determine whether an electronic component is appropriately mounted at the mounting position based on image data. Then, the operator may enter the determination result into control device 100, and controller 102 may perform processing according to the entered result.

Also, in the above embodiments, the movement path of mounting head 24 imaged using mark camera 80 is taken as the path from the supply position of the electronic component from tape feeder 76 to the position of mounting head 24 when mounting work was interrupted, but mark camera 80 may image only above circuit board 36 as the movement path of mounting head 24.

REFERENCE SIGNS LIST

10: electronic component mounter (mounter); 54: base; 70: suction nozzle (component holding tool); 80: mark camera (imaging device); 100: control device; 108: memory section; 110: mounting position imaging section; 112: mounting determination section; 114: error notification section; 116: path imaging section; 118: component determination section; 120: dropped notification section; 122: holding determination section

The invention claimed is:

1. A mounter comprising:
a component holding tool configured to hold a component and mount the held component on a board;
an imaging device configured to image any position on a base on which the board is loaded; and
a control device including:
    a path imaging section configured to, in a case in which mounting work is interrupted by a stoppage of the mounter and then restarted, use the imaging device to image the base on which the board is loaded along a path over which the component holding tool moved until a position of the component holding tool when mounting work was interrupted;
    a dropped component determination section configured to determine whether the component dropped on the base on which the board is loaded based on image data captured by the path imaging section; and
    a dropped notification section configured to report information to an operator indicating that the component has been dropped in a case in which the component was determined to have been dropped by the dropped component determination section.

2. The mounter according to claim 1, wherein the control device further includes
a holding determination section configured to, in a case in which mounting work is interrupted by the stoppage of the mounter and then restarted, determine whether the component holding tool is holding the component planned to be held after mounting work is restarted, and
the path imaging section is configured to, when the holding determination section determines that the component holding tool is not holding the component, use the imaging device to image the base on which the board is loaded along a path over which the component holding tool moved until the position of the component holding tool when mounting work was interrupted.

3. The mounter according to claim 1, wherein
the control device further includes
a memory section configured to memorize information indicating completion of mounting of the component on the board for each act of mounting the component on the board by the component holding tool;
a mounting position imaging section configured to, in a case in which mounting work is interrupted by a stoppage of the mounter and then restarted, use the imaging device to image a mounting position of the component on the board memorized on the memory section immediately before the mounting work was interrupted;
a mounting determination section configured to determine whether the component was mounted at the mounting position correctly based on image data captured by the mounting position imaging section, and
an error reporting section configured to report information to an operator indicating that mounting of the component at the mounting position was not correct in a case in which the mounting determination section determines that mounting of the component at the mounting position was not correct.

* * * * *